US006186269B1

(12) United States Patent
Vollmer et al.

(10) Patent No.: US 6,186,269 B1
(45) Date of Patent: Feb. 13, 2001

(54) MINI SURROUND SOUND LOUDSPEAKER

(76) Inventors: Edward Vollmer, 1378 Sunbeam Cir., San Jose, CA (US) 95128; Teresa Hart, 5501 Branciforte Dr., Santa Cruz, CA (US) 95065

( * ) Notice: Under 35 U.S.C. 154(b), the term of this patent shall be extended for 0 days.

(21) Appl. No.: 09/209,838

(22) Filed: Dec. 11, 1998

(51) Int. Cl.[7] ........ H05K 5/00
(52) U.S. Cl. ........ 181/144; 181/153
(58) Field of Search ........ 181/144, 147, 181/153, 156, 152, 154, 199, 196

(56) References Cited

U.S. PATENT DOCUMENTS 3,326,321 * 6/1967 Valuch ........ 181/199
4,580,654 * 4/1986 Hale ........ 181/199
5,847,331 * 12/1998 Vollmer et al. ........ 181/147

* cited by examiner

*Primary Examiner*—Khanh Dang
(74) *Attorney, Agent, or Firm*—Siemens Patent Services,LC

(57) ABSTRACT

A compact loudspeaker having a vertically oriented cylindrical housing supporting a relatively high frequency sound driver and a relatively low frequency sound driver. The high frequency driver closes the top of the housing, and is oriented to project sound upwardly. The low frequency driver is contained within the housing such that it divides the housing into upper and lower sound propagating chambers. The low frequency drive projects sound downwardly into the lower chamber. The lower chamber is closed at the bottom of the housing by a bottom plate. The lower chamber has a port communicating to the exterior of the housing. A crossover network is mounted to the bottom plate. Input terminals are located in the lateral surface of the housing. The interior of the housing is lined with acoustic padding for sound damping. The exterior of the housing is covered with a grille cloth, which in turn is covered with screen material. Decorative trim rings cover the upper and lower edges of the grille cloth and screening. A smaller trim ring is inlaid around the port. The overall height of the housing is six and one half inches, while the overall diameter is four and one half inches. The port is one and one quarter inches in diameter, and has a one inch long tube projecting outside the housing.

10 Claims, 2 Drawing Sheets

MINI SURROUND SOUND LOUDSPEAKER

CROSS REFERENCE TO RELATED APPLICATIONS

This application is related to my prior patent application Ser. No. 08/948,234 issued on Dec. 8, 1998 as U.S. Pat. No. 5,847,331.

BACKGROUND OF THE INVENTION

1. Field of the Invention

The present invention relates to loudspeakers which process input signals and project corresponding sound outputs to a listening audience. In particular, the invention sets forth a loudspeaker which propagates coherent sound waves in the manner of a point source.

2. Description of the Prior Art

Standard loudspeakers are generally constructed to include two or more sound drivers to reproduce relatively high, medium, and low frequency sound ranges. These typical loudspeakers are arranged such that their sound drivers face the audience. This produces sound which propagates in the form of a wedge. Sound thus created is noncoherent and has distorted stereo resolution, and loses true audible frequency spectrum which is received and interpreted by the human ear.

Applicants are unaware of prior art patents which describe the instant invention as claimed.

SUMMARY OF THE INVENTION

The present invention sets forth a loudspeaker which utilizes a relatively low range driver, preferably one which generates sound in the band known as midrange or low range, and a relatively high frequency driver. The novel loudspeaker is configured to propagate coherent sound waves spherically in a time and phase relationship omnipresently from a virtual point source. The loudspeaker achieves these goals while being miniature in size, compared to conventional speakers.

The midrange driver is arranged to project sound downwardly into a ported cylindrical housing. The high frequency driver is arranged to project sound upwardly out of the housing. The bottom of the housing is closed. The low frequency driver divides the housing into two sound propagating chambers. That chamber receiving sound projected from the low frequency driver is ported to discharge sound. The sound drivers are coaxially oriented within the housing.

A crossover network is located at the bottom of the lower sound chamber. The crossover network is operably connected to the sound drivers. Input terminals connected to the crossover network are mounted to the housing on a lateral, exterior surface.

Accordingly, it one object of the invention to provide a speaker which propagates coherent sound waves spherically in the manner of a virtual point source.

It is another object of the invention that the novel speaker be of compact size.

It is a further object of the invention to have a crossover network operably connected to the sound drivers.

Still another object of the invention is that the housing be cylindrical.

An additional object of the invention is to provide two sound propagating chambers.

A further object of the invention is that input terminals be located on a lateral, exterior surface of the loudspeaker.

Yet another object of the invention is that the sound drivers be coaxial.

Still another object of the invention is that the sound drivers be oriented to project sound in opposite directions.

It is an object of the invention to provide improved elements and arrangements thereof in an apparatus for the purposes described which is inexpensive, dependable and fully effective in accomplishing its intended purposes.

These and other objects of the present invention will become readily apparent upon further review of the following specification and drawings.

BRIEF DESCRIPTION OF THE DRAWINGS

Various other objects, features, and attendant advantages of the present invention will become more fully appreciated as the same becomes better understood when considered in conjunction with the accompanying drawings, in which like reference characters designate the same or similar parts throughout the several views, and wherein.

DETAILED DESCRIPTION OF THE PREFERRED EMBODIMENTS

Figure 1:
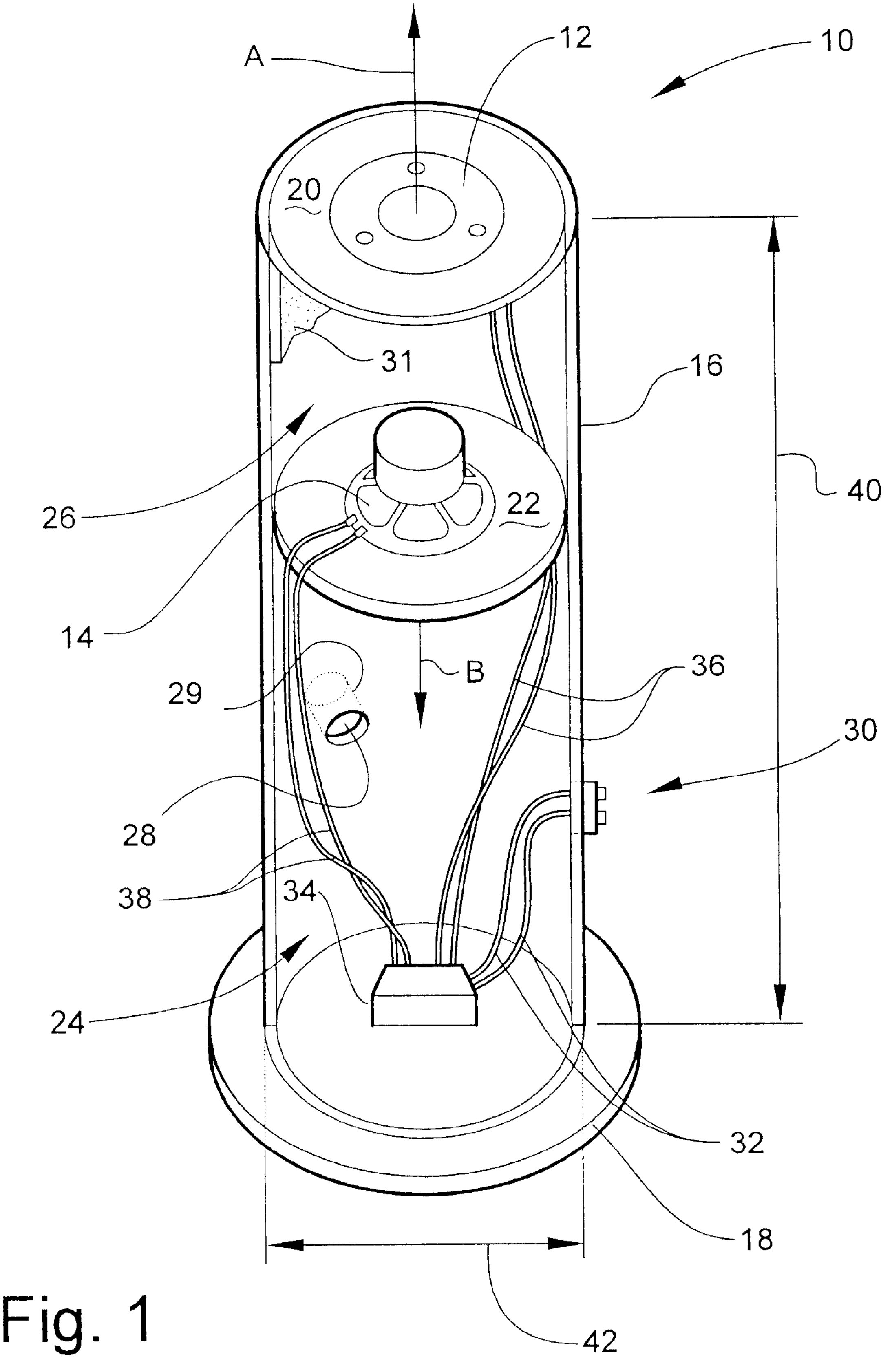
FIG. 1 is perspective view of functional components of the invention, partially broken away to reveal internal detail.

Turning now to FIG. 1 of the drawings, loudspeaker 10 is seen to comprise a relatively high frequency sound driver 12 and a relatively low frequency sound driver 14 mounted on a cylindrical housing 16. Loudspeaker 10 has only two drivers 12, 14. Housing 16 is formed from materials such as, illustratively, polyvinyl chloride (PVC) and acrylonitrile butadiene styrene (ABS), and is closed at its bottom end by a plate 18. Plate 18 is tightly sealed to housing 16. Illustratively, plate 18 is routed so that housing 16 fits thereinto, and is then sealed with silicone. A first ring or disc 20 and a second ring or disc 22 respectively support drivers 12, 14. A sound propagating chamber 24 is formed within housing 16 below low frequency driver 14 and above bottom plate 18.

High frequency driver 12 closes the upper end of housing 16. Driver 12 is oriented to project sound upwardly, away from housing 16. This is indicated by arrow A. Driver 14 is oriented in the opposite direction, and projects sound downwardly, as indicated by arrow B. Arrows A and B also indicate the vertical axis of housing 16. Drivers 12 and 14 are arranged to propagate sound coaxially. A sound propagating chamber 26 is formed between driver 12 and driver 14. Chamber 26 does not have an opening porting sound to the exterior of housing 16. By contrast, chamber 24 has a port 28 formed in the lateral wall of housing 16, which port 28 establishes communication between chamber 24 and the exterior of housing 16. A short tube 29 extends outwardly from port 28.

Chambers 24, 26 are lined with acoustic padding (shown representatively at 31). This padding is about one quarter inch thick, and has acoustic damping factors equivalent to those of one inch cotton batting.

An input terminal assembly 30 having two terminals for connection to positive and negative input signals is mounted in the lateral wall of housing 16. Conductors 32 connect terminal assembly 30 to a crossover network 34 which in turn is operably connected to sound drivers 12, 14 by conductors 36, 38 (respectively). Crossover network 34 sends appropriate bandpass frequencies to drivers 12, 14 so as to ensure smooth transition of frequency bands of the audible spectrum to the respective sound drivers. Crossover network 34 is mounted on bottom plate 18.

The overall height of housing 16, indicated by arrow 40 is in a range of six to seven inches, and is preferably six and one half inches. The overall diameter of housing 16, indicated by arrow 42, is in a range of four to five inches, and is preferably four and one half inches. When these dimensions are employed, the overall diameter of port 28 is preferably one and one quarter inches in diameter, with tube 29 being about one inch long.

Figure 2:
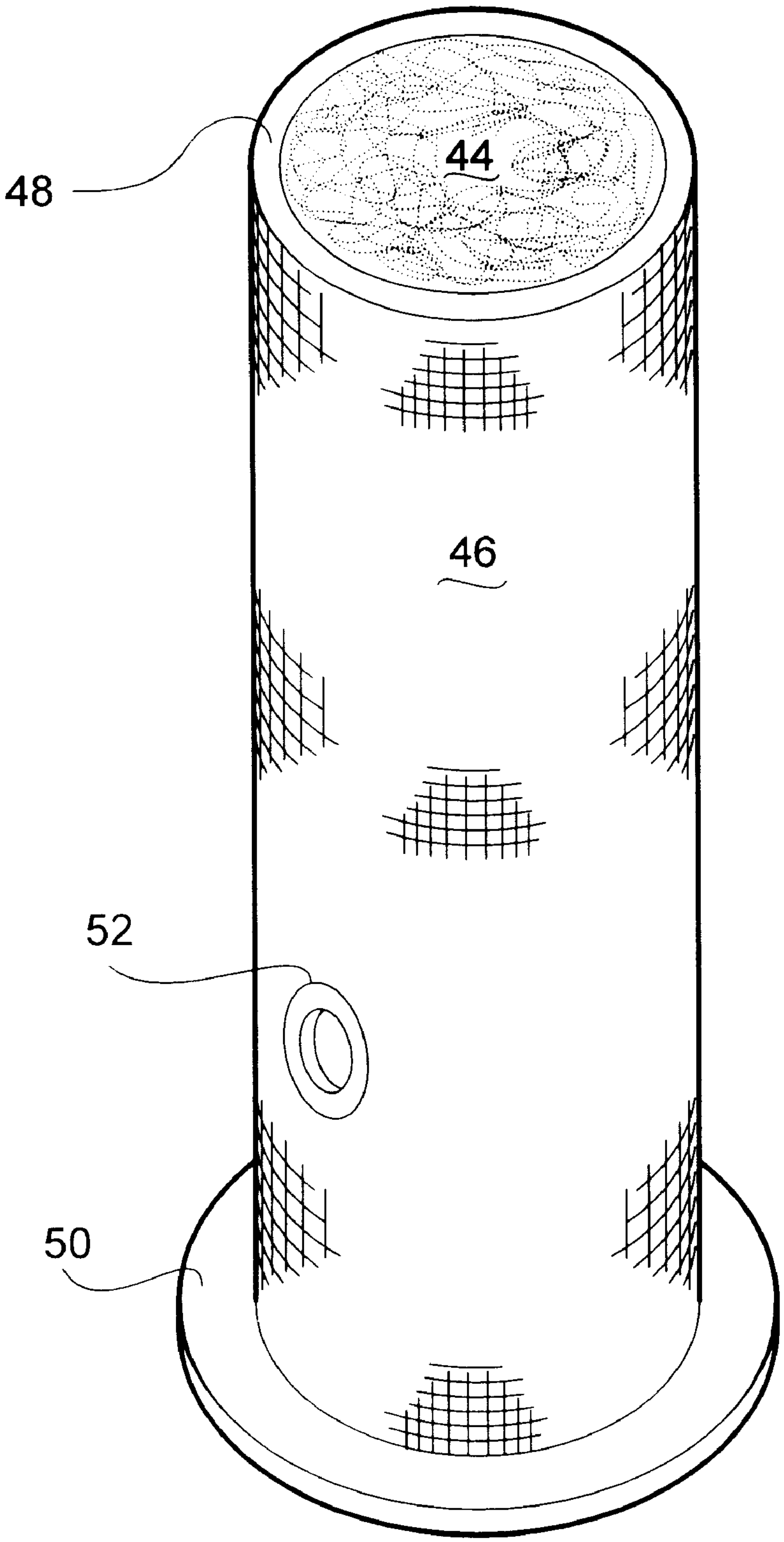
FIG. 2 is a perspective view showing external ornamental components of the novel loudspeaker.

FIG. 2 illustrates external components covering the components of FIG. 1 at the lateral surface thereof. A translucent grille cloth 44 is wrapped around housing 16. Cloth 44 is covered by screening 46. A circular decorative ring 48 is affixed atop screening 46. A similar decorative ring 50 is located at the bottom of screening 46. Another decorative ring 52 is inlaid around port 28.

It is to be understood that the present invention is not limited to the embodiments described above, but encompasses any and all embodiments within the scope of the following claims.

What is claimed is:

1. A loudspeaker comprising a cylindrical housing having two and only two sound drivers including a relatively high frequency driver and a relatively low frequency driver, wherein said housing has an upper end and a lower end, said high frequency driver is located at and closes said upper end of said housing, said housing has a bottom plate located at said lower end of said housing, said bottom plate closing said lower end of said housing, wherein said low frequency driver is disposed within said housing and is disposed to seal the interior of said housing into a first chamber located between said high frequency driver and a second chamber located between said low frequency driver and said bottom plate, wherein said high frequency driver is oriented to project sound away from said housing and said low frequency driver is oriented to project sound into said second chamber, and said second chamber has a port formed in said housing, establishing communication between said second chamber and the exterior of said housing.

2. The loudspeaker according to claim 1, further comprising a crossover network connected to said high frequency driver and to said low frequency driver.

3. The loudspeaker according to claim 2, wherein said crossover network is located at said bottom plate of said housing.

4. The loudspeaker according to claim 1, wherein said housing has a first disc and a second disc projecting to the inside thereof, said low frequency driver is supported on and sealed to said first disc, and said high frequency driver is supported on and sealed to said second disc.

5. The loudspeaker according to claim 1, wherein said housing has a length the magnitude of which is in a range of six to seven inches, and a diameter the magnitude of which is in a range of four to five inches.

6. The loudspeaker according to claim 5, wherein said port of said second chamber of said housing has a diameter the magnitude of which is in a range of one to one and one half inches.

7. The loudspeaker according to claim 1, wherein said housing has an axis, and said low frequency sound driver and said high frequency sound driver are coaxially oriented along said axis of said housing.

8. The loudspeaker according to claim 1, further comprising a translucent grille cloth wrapped around said housing, a screen covering said cloth, a first decorative ring affixed atop said screen, a second decorative ring located at the bottom said screen, and a third decorative ring inlaid around said port of said housing.

9. A loudspeaker comprising a cylindrical housing having two and only two sound drivers including a relatively high frequency driver and a relatively low frequency driver, wherein said housing has an axis, an upper end, and a lower end, said high frequency driver is located at and closes said upper end of said housing, said housing has a first disc and a second disc projecting to the inside thereof, said low frequency driver is supported on and sealed to said first disc, said high frequency driver is supported on and sealed to said second disc, and said low frequency sound driver and said high frequency sound driver are coaxially oriented along said axis of said housing, a bottom plate located at said lower end of said housing, said bottom plate closing said lower end of said housing, wherein said low frequency driver is disposed within said housing and is disposed to seal the interior of said housing into a first chamber located between said high frequency driver and a second chamber located between said low frequency driver and said bottom plate, said high frequency driver is oriented to project sound away from said housing and said low frequency driver is oriented to project sound into said second chamber, and said second chamber has a port formed in said housing, establishing communication between said second chamber and the exterior of said housing, said loudspeaker further comprising a crossover network connected to said high frequency driver and to said low frequency driver, wherein said crossover network is located at said bottom plate of said housing, wherein said housing has a length the magnitude of which is in a range of six to seven inches and a diameter the magnitude of which is in a range of four to five inches, and said port of said second chamber of said housing has a diameter the magnitude of which is in a range of one to one and one half inches.

10. The loudspeaker according to claim 9, further comprising a translucent grille cloth wrapped around said housing, a screen covering said cloth, a first decorative ring affixed atop said screen, a second decorative ring located at the bottom said screen, and a third decorative ring inlaid around said port of said housing.

* * * * *